(12) United States Patent
Morein et al.

(10) Patent No.: US 10,042,488 B2
(45) Date of Patent: Aug. 7, 2018

(54) THROUGH SILICON VIAS FOR BACKSIDE CONNECTION

(71) Applicant: Synaptics Incorporated, San Jose, CA (US)

(72) Inventors: Stephen L. Morein, San Jose, CA (US); Joseph Kurth Reynolds, Alviso, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 95 days.

(21) Appl. No.: 14/675,671

(22) Filed: Mar. 31, 2015

(65) Prior Publication Data
US 2015/0286318 A1    Oct. 8, 2015

Related U.S. Application Data

(60) Provisional application No. 61/975,703, filed on Apr. 4, 2014.

(51) Int. Cl.
    H01L 27/14        (2006.01)
    G06F 3/044        (2006.01)
    H01L 21/768       (2006.01)
    H01L 23/48        (2006.01)

(52) U.S. Cl.
    CPC ........ *G06F 3/044* (2013.01); *H01L 21/76898* (2013.01); *H01L 23/481* (2013.01); *G06F 2203/04101* (2013.01); *G06F 2203/04103* (2013.01); *H01L 2924/0002* (2013.01)

(58) Field of Classification Search
    CPC ......... H01L 2924/0002; H01L 2924/00; H01L 21/76898; H01L 23/481; H01L 27/14636; H01L 2924/10157; H01L 31/02; H01L 2924/14

USPC ........................................................ 257/414
See application file for complete search history.

(56) References Cited

U.S. PATENT DOCUMENTS

| | | | |
|---|---|---|---|
| 5,406,425 A | 4/1995 | Johnston et al. | |
| 5,424,245 A | 6/1995 | Gurtler et al. | |
| 6,117,705 A * | 9/2000 | Glenn | G11C 16/18 257/E23.181 |
| 6,168,969 B1 | 1/2001 | Farnworth | |

(Continued)

OTHER PUBLICATIONS

Barbero, et al. TSV Prototype Results IZM' University of Bonn Nov. 16, 2011, pp. 1-25.

(Continued)

*Primary Examiner* — Duy T Nguyen
(74) *Attorney, Agent, or Firm* — Patterson + Sheridan, LLP (57) ABSTRACT

In an example, a method of processing an integrated circuit (IC) die including active circuitry formed on a substrate and a front side having a plurality of metal layers formed on the substrate. The method includes forming vias in a substrate of the IC die using a laser configured to drill the vias from the front side of the IC die. The method includes forming metal contacts on first metal pads, and metal interconnects between second metal pads and the vias, using an single electroplating process, where the first metal pads and the second metal pads are exposed parts of a top layer of the plurality of metal layers, and where the metal interconnects at least partially fill the vias. The method includes thinning the substrate of the IC die to expose the metal interconnects in the vias at a back side of the IC die opposite the front side.

10 Claims, 7 Drawing Sheets

(56) References Cited

U.S. PATENT DOCUMENTS

| | | | |
|---|---|---|---|
| 6,225,651 B1* | 5/2001 | Billon | H01L 21/76898 |
| | | | 257/190 |
| 6,800,930 B2 | 10/2004 | Jackson et al. | |
| 7,683,459 B2 | 3/2010 | Ma et al. | |
| 8,319,325 B2 | 11/2012 | Henderson et al. | |
| 8,486,805 B2 | 7/2013 | Zhao et al. | |
| 8,717,775 B1* | 5/2014 | Bolognia | G06K 9/00053 |
| | | | 361/761 |
| 8,766,409 B2 | 7/2014 | Yu | |
| 2006/0079019 A1* | 4/2006 | Kim | H01L 23/3114 |
| | | | 438/106 |
| 2006/0086890 A1* | 4/2006 | Chao | H01L 27/14618 |
| | | | 250/208.1 |
| 2006/0191351 A1* | 8/2006 | Meehan | G01L 1/142 |
| | | | 73/780 |
| 2010/0230818 A1 | 9/2010 | Birner et al. | |
| 2011/0056862 A1* | 3/2011 | Tamura | H01L 21/67333 |
| | | | 206/503 |
| 2013/0270702 A1 | 10/2013 | Yu et al. | |
| 2014/0197500 A1* | 7/2014 | Guillemet | G01N 27/227 |
| | | | 257/414 |
| 2014/0217590 A1 | 8/2014 | Nalla et al. | |

OTHER PUBLICATIONS

Kruger et al., "UV Laser Processing for Semiconductor Devices" Laser Technik Journal, May 2013, pp. 26-30.

* cited by examiner

THROUGH SILICON VIAS FOR BACKSIDE CONNECTION

CROSS-REFERENCE TO RELATED APPLICATIONS

This application claims benefit of U.S. provisional patent application Ser. No. 61/975,703, filed Apr. 4, 2014, which is incorporated by reference herein.

BACKGROUND

Field of the Disclosure

Embodiments of disclosure generally relate to integrated circuits and, more particularly, to an integrated circuit with through-silicon vias for backside connection of a flexible circuit.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

In an embodiment, a method of processing an integrated circuit (IC) die including active circuitry formed on a substrate and a front side having a plurality of metal layers formed on the substrate. The method includes forming vias in a substrate of the IC die using a laser configured to drill the vias from the front side of the IC die. The method further includes forming metal contacts on first metal pads, and metal interconnects between second metal pads and the vias, using an single electroplating process, where the first metal pads and the second metal pads are exposed parts of a top layer of the plurality of metal layers, and where the metal interconnects at least partially fill the vias. The method further includes thinning the substrate of the IC die to expose the metal interconnects in the vias at a back side of the IC die opposite the front side.

In another embodiment, an IC die includes a substrate having a plurality of metal layers formed on a front side, the plurality of metal layers electrically coupled to active circuitry in the substrate. The IC die further includes laser-drilled vias disposed through the substrate. The IC die further includes metal contacts disposed on first metal pads, the first metal pads comprising exposed parts of a top layer of the plurality of metal layers. The IC die further includes metal interconnects disposed between second metal pads and the laser-drilled vias, the second metal pads comprising exposed parts of the top layer of the plurality of metal layers, the metal interconnects at least partially filling the laser-drilled vias. The IC die further includes back side contacts disposed on a back side of the substrate, the back side contacts comprising exposed portions of the metal interconnects in the laser-drilled vias.

In another embodiment, a display device includes a glass substrate, display electrodes, capacitive sensor electrodes, and traces disposed on the glass substrate coupled to the display electrodes and the capacitive sensor electrodes. The display device further includes an IC die mounted to the glass substrate. The IC die includes metal contacts on a front side of the IC die facing the glass substrate and electrically coupled to the traces, and back side contacts on a back side of the IC die opposite the front side and electrically coupled to through die vias (TDVs) in the IC die. The display device further includes a flexible circuit soldered to the back side contacts of the IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Figure 1:
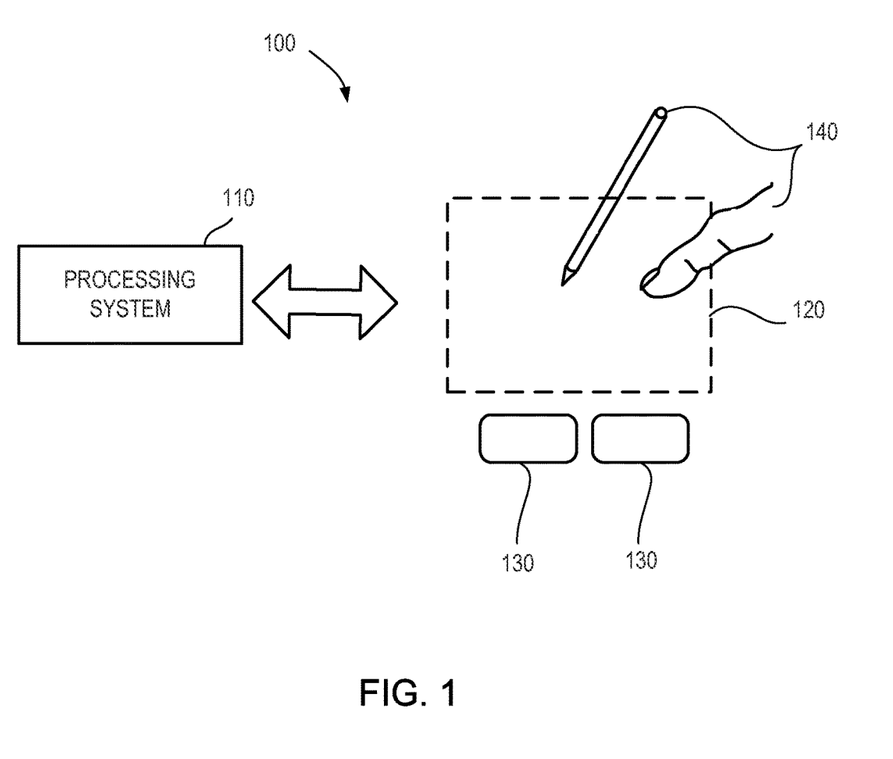
FIG. 1 is a block diagram of an exemplary input device, according to one embodiment described herein.

FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
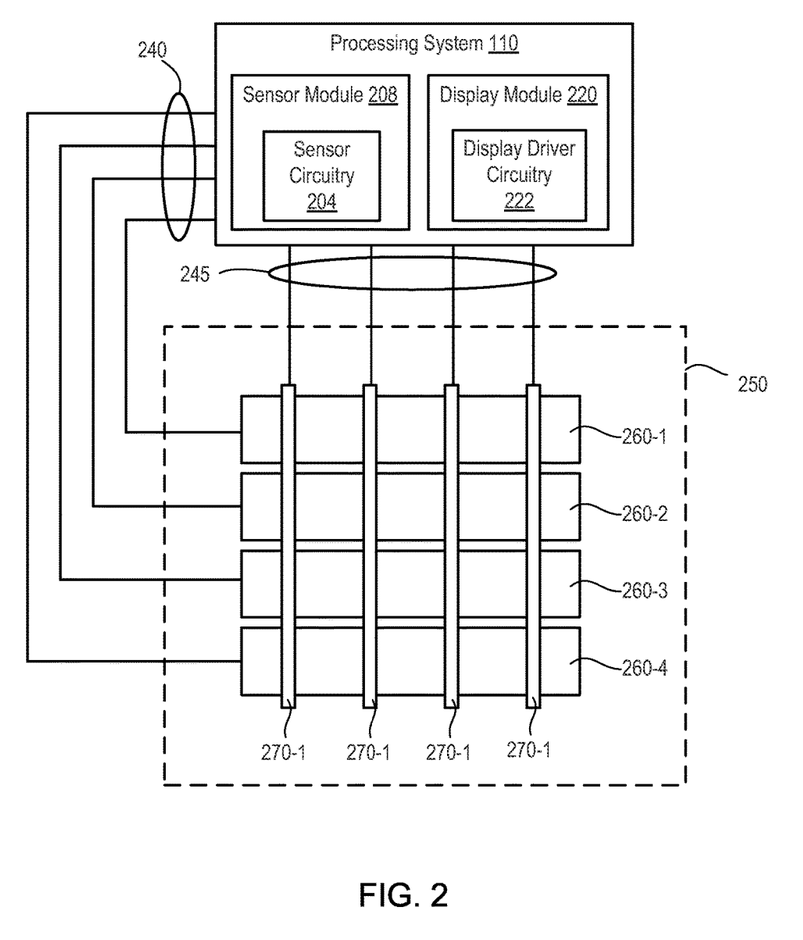
FIG. 2 illustrates a portion of an exemplary pattern of sensing elements according to some embodiments.

FIG. 2 illustrates a portion of an exemplary pattern of sensing elements according to some embodiments. For clarity of illustration and description, FIG. 2 shows the sensing elements in a pattern of simple rectangles and does not show various components, such as various interconnects between the sensing elements and the processing system 110. An electrode pattern 250 comprises a first plurality of sensor electrodes 260 (260-1, 260-2, 260-3, . . . 260-$n$), and a second plurality of sensor electrodes 270 (270-1, 270-2, 270-3, . . . 270-$m$) disposed over the first plurality of electrodes 260. In the example shown, n=m=4, but in general n and m are each positive integers and not necessarily equal to each other. In one embodiment, the first plurality of sensor electrodes 260 are operated as a plurality of transmitter electrodes and the second plurality of sensor electrodes 270 are operated as a plurality of receiver electrodes. In another embodiment, one plurality of sensor electrodes may be configured to transmit and receive and the other plurality of sensor electrodes may also be configured to transmit and receive. In other embodiments, as least one of the first and second plurality of sensor electrodes may be operated by as absolute capacitive sensing electrodes. The first plurality of sensor electrodes 260, and the second plurality of sensor electrodes 270, or both can be disposed within the sensing region 120. The electrode pattern 250A can be coupled to the processing system 110. While the sensor electrodes are shown as rectangles, the electrodes can be of any shape or size and can have varying shapes and/or sizes. In addition, the processing system 110 can be coupled to other electrode patterns, such as a matrix pattern of sensor electrodes where each sensor electrode corresponds to a capacitive pixel.

The first plurality of sensor electrodes 260 and second plurality of sensor electrodes 270 are typically ohmically isolated from each other. That is, one or more insulators separate the first plurality of sensor electrodes 260 and the second plurality of sensor electrodes 270 and prevent them from electrically shorting to each other. In some embodiments, the first plurality of sensor electrodes 260 and the second plurality of sensor electrodes 270 are separated by insulative material disposed between them at cross-over areas; in such constructions, the first plurality of sensor electrodes 260 and/or the second plurality of sensor electrodes 270 can be formed with jumpers connecting different portions of the same electrode. In some embodiments, the first plurality of sensor electrodes 260 and/or the second plurality of sensor electrodes 270 are separated by one or more layers of insulative material. In such embodiments, the first plurality of sensor electrodes 260 and the second plurality of sensor electrodes 270 can be disposed on separate layers of a common substrate. In various embodiments, the first plurality of sensor electrodes 260 and the second plurality of sensor electrodes 270 are disclosed on a common layer of a substrate. In some other embodiments, the first plurality of sensor electrodes 260 and the second plurality of sensor electrodes 270 are separated by one or more substrates; for example, the first plurality of sensor electrodes 260 and the second plurality of sensor electrodes 270 can be disposed on opposite sides of the same substrate, or on different substrates that are laminated together.

The areas of localized capacitive coupling between the first plurality of sensor electrodes 260 and the second plurality of sensor electrodes 270 may be termed "capacitive measurements." Further, the areas of localized capacitive coupling between the first plurality of sensor electrodes 260 and an input object and the second plurality of sensor electrodes 270 and an input object may be termed "capacitive measurements." In some embodiments, the capacitive measurements may be used to form one/or more capacitive images. In other embodiments, the capacitive measurements may be used to form one/or more profiles along an axis of the input device. The capacitive coupling between the first plurality of sensor electrodes 260 and the second plurality of sensor electrodes 270 and the capacitive coupling between the first plurality of sensor electrodes 260 and an input object and the second plurality of sensor electrodes 270 and an input object change with the proximity and motion of input objects in the sensing region 120. The processing system 110 is coupled to the first plurality of sensor electrodes 260 through traces 240. The processing system 110 is coupled to the second plurality of sensor electrodes 270 through traces 245.

The processing system 110 can include a sensor module 208 having sensor circuitry 204. The sensor module 208 can comprise a capacitive sensing device. The sensor module 208 operates the electrode pattern 250 by coupling voltage, current, or charge to electrodes in the electrode pattern 250. The sensor module 208 can couple constant, substantially constant, or time-varying voltage to electrodes in the electrode pattern 250. The sensor module 208 can include transmitter(s) for coupling transmitter signals to the first plurality of sensor electrodes 260 when they are configured as transmitter electrodes. The sensor module 208 can include receiver(s) for receiving resulting signals from the second plurality of sensor electrodes 270 when they are configured as receiver electrodes. In some embodiments, the second plurality of sensor electrodes may be also coupled to the transmitter(s) to be operated as transmitter electrodes and the first plurality of sensor electrodes 270 may be coupled to the receiver(s) to be operated as receiver electrodes. Further, the receiver(s) may be configured to drive absolute capacitive signals (modulated signals) onto the first and/or the second plurality of sensor electrodes and to receiver resulting signals with the same electrodes to operate the first and/or second plurality of sensor electrodes as absolute capacitive sensing electrodes. In some embodiments, the transmitter(s) may be configured to drive the first and/or second plurality of sensor electrodes with absolute capacitive sensing signals while the receiver(s) receive resulting signals with the same electrodes to be operate the sensor electrodes absolute capacitive sensor electrodes. The processing system 110 can determine capacitive measurements from the resulting signals. The processing system 110 can track changes in the capacitive measurements to detect input object(s) in the sensing region 120.

In some touch screen embodiments, the first plurality of sensor electrodes 260 and/or the second plurality of sensor electrodes 270 comprise one or more display electrodes used in updating a display of a display screen, such as one or more segments of a "Vcom" electrode (common electrodes), source electrodes, gate electrodes, and one or more segments of an anode or cathode electrode. These display electrodes may be disposed on an appropriate display screen substrate. For example, the display electrodes may be disposed on a transparent substrate (a glass substrate, thin-film transistor (TFT) glass, or any other transparent material) in some display screens (e.g., In Plane Switching (IPS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. The display electrodes can also be referred to as "combination electrodes," since the common electrodes perform functions of display updating and capacitive sensing. In various embodiments, each sensor electrode of the first and/or second plurality of sensor electrodes comprises one or more combination electrodes. In other embodiments, at least two sensor electrodes may share at least one combination electrode. Furthermore, in one embodiment, both the first plurality of sensor electrodes 260 and the second plurality of sensor electrodes 270 are disposed within a display stack on the display screen substrate. Additionally, at least one of the sensor electrodes 260, 270 in the display stack may comprise a combination electrode. However, in other embodiments, only the first plurality of sensor electrodes 260 or the second plurality of sensor electrodes 270 (but not both) are disposed within the display stack, while other sensor electrodes are outside of the display stack (e.g., disposed on an opposite side of a color filter glass).

In some touch screen embodiments, the sensor module 208 controls voltage coupled to the common electrodes that are part of the first plurality of sensor electrodes 260. Thus, the sensor module 208 can selectively couple a common voltage (e.g., Vcom) or a modulated signal to the first plurality of sensor electrodes 260 and/or the second plurality of sensor electrodes. In some embodiments, the processing system 110 includes a display module 220 having display driver circuitry 222. The display module 220 can comprise a display driver device. The display driver circuitry 222 is configured to drive source electrodes (not shown) of a display device in which the electrode pattern 250 is integrated. The display module 220 can be configured to update the display. The processing system 110 can operate the electrode pattern 250 and the source lines to perform both capacitive sensing and display updating.

While separate modules 208 and 220 are shown, in general, the functions of driving electrodes, receiving from electrodes, and processing measurements can be performed by one or more modules in the processing system 110. In addition, the processing system 110 can be coupled to other electrode patterns, such as a matrix pattern of sensor electrodes.

Figure 3:
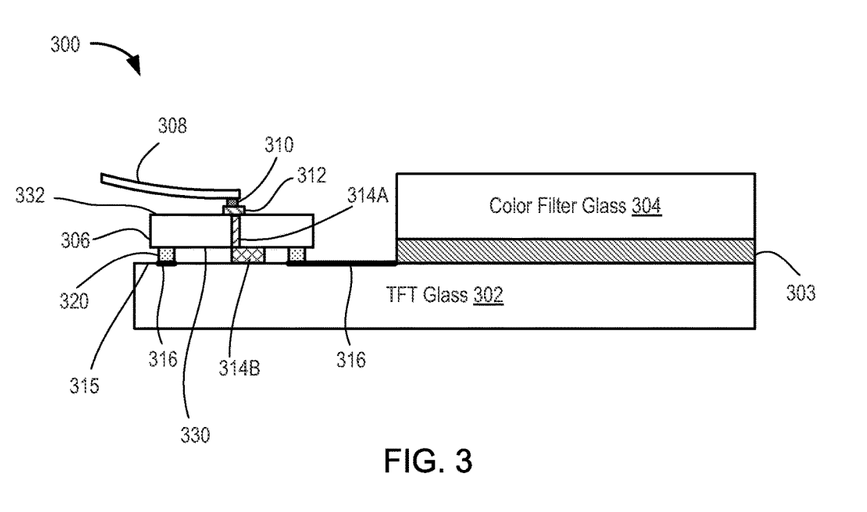
FIG. 3 is a block diagram depicting a cross-section of a display device according to an embodiment.

FIG. 3 is a block diagram depicting a cross-section of a display device 300 according to an embodiment. The display device 300 comprises a plurality of substrates, including a TFT glass substrate (TFT glass 302) and a color filter glass substrate (color filter glass 304). For purposes of clarity, other substrates the display device 300 are omitted. The other substrates can include, for example, a backlight module beneath the TFT glass 302 and/or a cover lens above the color filter glass 304. The color filter glass 304 is disposed over a portion of the TFT glass 302. A plurality of layers 303 are disposed between the color filter glass 304 and the TFT glass 302. The layers 303 can include, for example, a TFT layer, a display element layer (e.g., liquid crystal display (LCD) material, OLED material, etc.), an electrode layer (e.g., transmitters for a capacitive sensor), a color filter film layer, and the like. The display device 300 can include other layer(s) (not shown) formed on the color filter glass 304, such as an electrode layer (e.g., receiver electrodes for a capacitive sensor), a polarizing film layer, and the like. An exposed portion of the TFT glass 302 is referred to as a shelf 315 (or glass shelf 315).

The display device 300 includes an integrated circuit (IC) 306 (also referred to herein as an "IC die 306") disposed on the glass shelf 315 of the TFT glass 302. The IC 306 includes metal contacts 320 formed on a front side 330. The metal contacts 320 may be referred to herein as chip-on-glass (COG) bumps. The IC 306 is mounted to the glass shelf 315 such that the COG bumps 320 are electrically coupled to conductive traces (traces 316) formed on the TFT glass 302. The traces 316 can comprise a transparent conductive material, such as indium tin oxide (ITO) or the like. The COG bumps 320 can comprise gold or copper. The traces 316 can be coupled to electrodes in the layers 303, such as transmitter electrodes for a capacitive sensor and/or source/gate electrodes coupled to thin-film transistors. The COG bumps 320 electrically couple the traces 316 to conductive layer(s) and active circuitry of the IC 306 (shown below). The IC 306 can include circuitry configured to operate the electrodes, such as capacitive sensor circuitry and/or display driver circuitry. An IC 306 having both capacitive sensor circuitry and display driver circuitry is referred to as a Touch Display Driver Integration (TDDI) IC. In an embodiment, the IC 306 comprises a TDDI IC. Alternatively, the IC 306 can include only capacitive sensor circuitry. The IC 306 can be secured to the glass shelf 315 using an epoxy or like material (not shown). In an embodiment, a light-blocking material (not shown) can be disposed between the IC 306 and the TFT glass 302.

The IC 306 includes back side contacts 312 disposed on a back side 332 of the IC 306. The back side contacts 312 are electrically coupled to through-silicon vias (TSVs) 314A (also referred to as through-die vias (TDVs)) formed in the IC 306. In an embodiment, the TSVs 314A comprise laser-drilled vias that are at least partially filled with metal. The TSVs 314A are electrically coupled to metal segments 314B disposed on the front side 330 of the IC 306. Together, the TSVs 314A and metal segments 314B comprise metal interconnects 314.

The display device 300 includes a flexible circuit 308. The flexible circuit 308 includes contacts 310 that are electrically and mechanically coupled to the back side contacts 312. For example, the flexible circuit 308 can be soldered to the back side contacts 312. The metal interconnects 314 electrically couple the back side contacts 312 to conductive layer(s) and active circuitry of the IC 306. The flexible circuit 308 includes conductors (not shown) coupled to the contacts 310 for providing voltage and signals to the IC 306 (e.g., supply voltage, control signals, etc.), and for receiving signals from the IC 306 (e.g., signals to be coupled to receiver electrodes for capacitive sensor circuitry). The flexible circuit 308 can include other portions (not shown) that couple to other electrodes (e.g., receiver electrodes on the color filter glass 304).

The TSVs 314A allow the flexible circuit 308 to be coupled directly to the IC 306, which improves electrical performance and allows the glass shelf 315 to be shortened compared to that of a non-TSV approach. In a non-TSV approach, the flexible circuit is typically mounted to the TFT glass adjacent to the IC, which requires both room on the TFT glass and traces formed on the TFT glass between the flexible circuit and the IC. By directly coupling the flexible circuit 308 to the IC 306 using the TSVs 314A, resistance between the flexible circuit 308 and the IC 306 is reduces, allowing for increased signal integrity between the flexible circuit 308 and the IC 306.

In an embodiment, the COG bumps 320 are disposed along a perimeter of the IC 306, and the metal interconnects 314 and back side contacts 312 are disposed within the perimeter of the IC 306. In a non-limiting example, the back side contacts 312 can have a width greater than or equal to 500 microns, a length greater than or equal to 50 microns, and a pitch of about 100 microns. The back side contacts 312 can have other width, length, and/or pitch values less than the 500 microns, 50 microns, and 100 microns, respectively. In another embodiment, the COG bumps 320 can be disposed along one edge of the IC 306, and the TSVs 314A and the back side contacts 312 can be disposed along another edge of the IC 306.

In an embodiment, the contacts 310 on the flexible circuit 308 can be larger than the back side contacts 312 to increase the probability of a reliable connection therebetween. The contacts 310 can be formed in any arrangement that allows electrical connection between the contacts 310 and the back side contacts 312 on the IC 306.

In an embodiment, the IC 306, as mounted to the TFT glass 302, has a height such that the surface of the back side 332 does not extend beyond the top surface of the color filter glass 304. In an embodiment, the IC 306, as mounted to the TFT glass 302, has a height such that a top surface of the flexible circuit 308 does not extend beyond the top surface of the color filter glass 304. In an embodiment, the flexible circuit 308 overlaps a substantial portion of the IC 306. For example, the flexible circuit 308 can overlap about 90 percent of the IC 306. In other embodiments, the flexible circuit 308 overlaps less than 90 percent of the IC 306 or more than 90 percent of the IC 306. In one embodiment, the "overlap" refers to both a width and a length of the IC 306 (e.g., overlap with respect to a surface area of the IC 306). In other embodiments, "overlap" refers to only one of the length or the width of the IC 306. In some embodiments, the flexible circuit 308 can overlap the length of the IC 306 by a different percentage than the width of the IC 306.

Figure 8A:
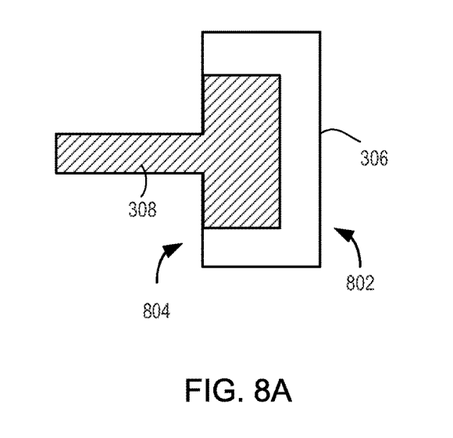
FIG. 8A is a top-down view of an IC having a flexible circuit attached thereto.
Figure 8B:
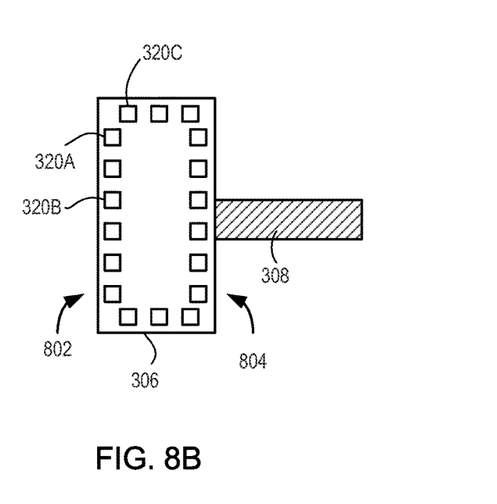
FIG. 8B is a bottom-up view of an IC having a flexible circuit attached thereto.

FIG. 8A is a top-down view of the IC 306 having the flexible circuit 308 attached thereto. FIG. 8B is a bottom-up view of the IC 306. In the example, the overlapping area between the IC 306 and the flexible circuit 308 is rectangular in shape, however any shape of overlap can be used. Further, the flexible circuit 308 can be centered on the IC 306 or be coupled more to one end than the other. The flexible circuit 308 is connected on a long side 804 of the IC 306 and extends towards a long side 802 of the IC 306. While the IC 306 is shown as being rectangular with long sides and perpendicular short sides, the IC 306 can also be of square shape having equal sides.

In some embodiments, the COG bumps 320 are disposed along the perimeter of the IC 306. The COG bumps 320 can be disposed along each side of the IC 306, or along one or more sides of the IC 306. In an embodiment, the long side 802 of the IC 306 includes a plurality of COG bumps 320A that function as source driver bumps (e.g., driven by a display driver in IC 306). In some embodiments, one or more COG bumps 320B that function as capacitive sensing bumps can be disposed among the source driver bumps 320A on the long side 802 of the IC 306. In some embodiments, at least one of the COG bumps 320A, 320B on the long side 802 of the IC 306 is configured to perform both source driving and capacitive sensing. COG bumps 320 along the long side 804 can be configured similarly as with the long side 802. In an embodiment, COG bumps 320C along a short side of the IC 306 perpendicular to the long sides 802 and 804 can include COG bumps 320C that function as capacitive sensing bumps. For example, COG bumps 320A along the long side 802 and/or the long side 804 can function as source driver bumps, and COG bumps 320C along one or both of the short sides of the IC 306 can function as capacitive sensing bumps. Those skilled in the art will appreciate that various arrangements of COG bumps 320 can be formed on the IC 306, each having one or more functions.

Figure 4:
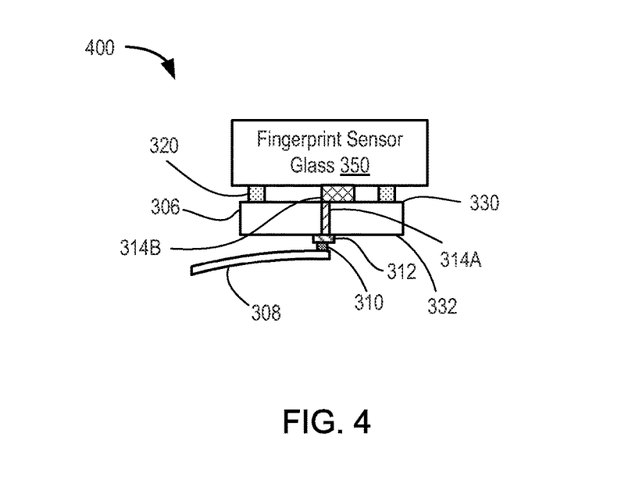
FIG. 4 is a block diagram showing a cross-section of a fingerprint sensor according to an embodiment.

FIG. 4 is a block diagram showing a cross-section of a fingerprint sensor 400 according to an embodiment. The configuration of the IC 306 in the display device 300 can be used in similar fashion for the fingerprint sensor 400. The fingerprint sensor 400 includes a fingerprint sensor glass substrate (fingerprint sensor glass 350). The IC 306 is mounted to the fingerprint sensor glass 350 using epoxy or the like (not shown). Rather than being configured for coupling to traces on the glass, the metal contacts 320 are configured to implement sensor electrodes for capacitive sensor circuitry in the IC 306. Similar to the display device 300, the flexible circuit 308 is electrically and mechanically coupled to the back side contacts 312, which are in turn coupled to circuitry of the IC 306 using the metal interconnects 314 formed from TSVs 314A and metal segments 314B. The flexible circuit 308 can be used to provide voltage and signals to the IC 306 and receive signals from the IC 306 to support its function as a fingerprint sensor.

Figure 5A:
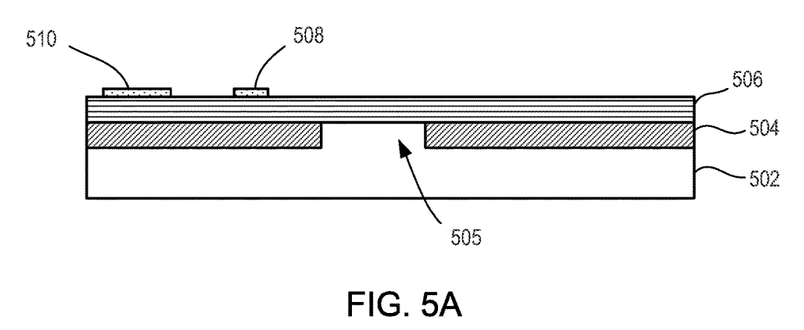
FIGS. 5A-5F depict cross-sections of the IC after different stages of manufacture.
Figure 5B:
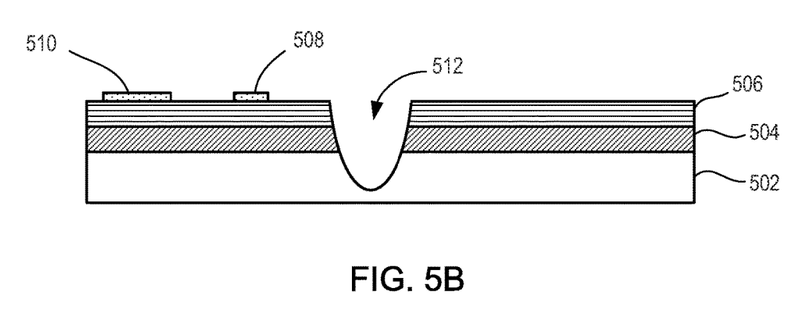
Figure 5C:
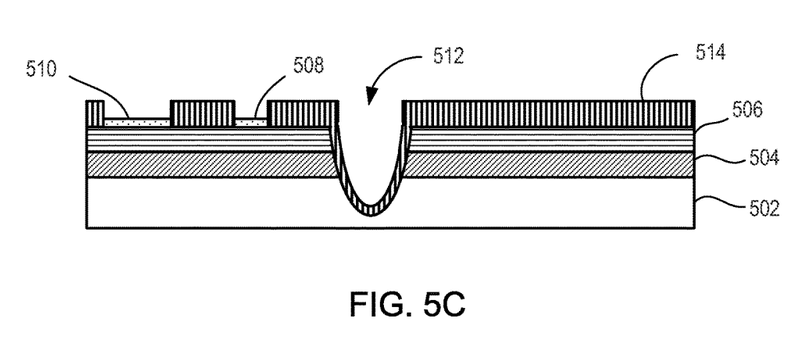
Figure 5D:
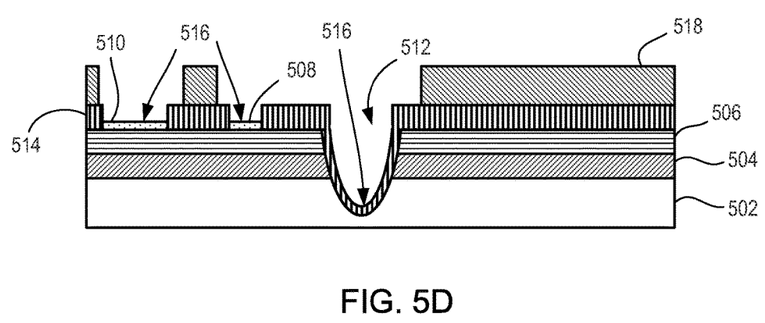
Figure 5E:
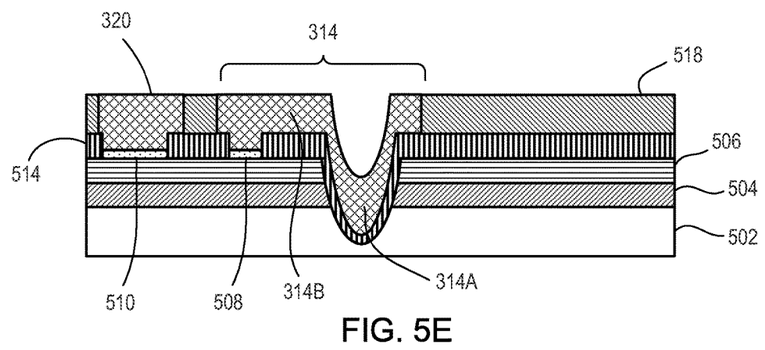
Figure 5F:
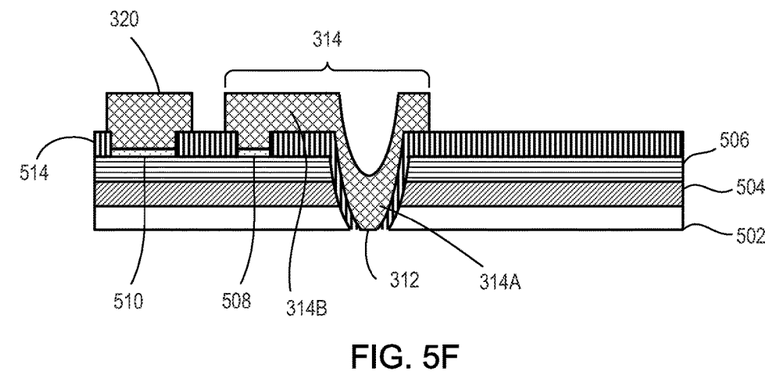
Figure 6:
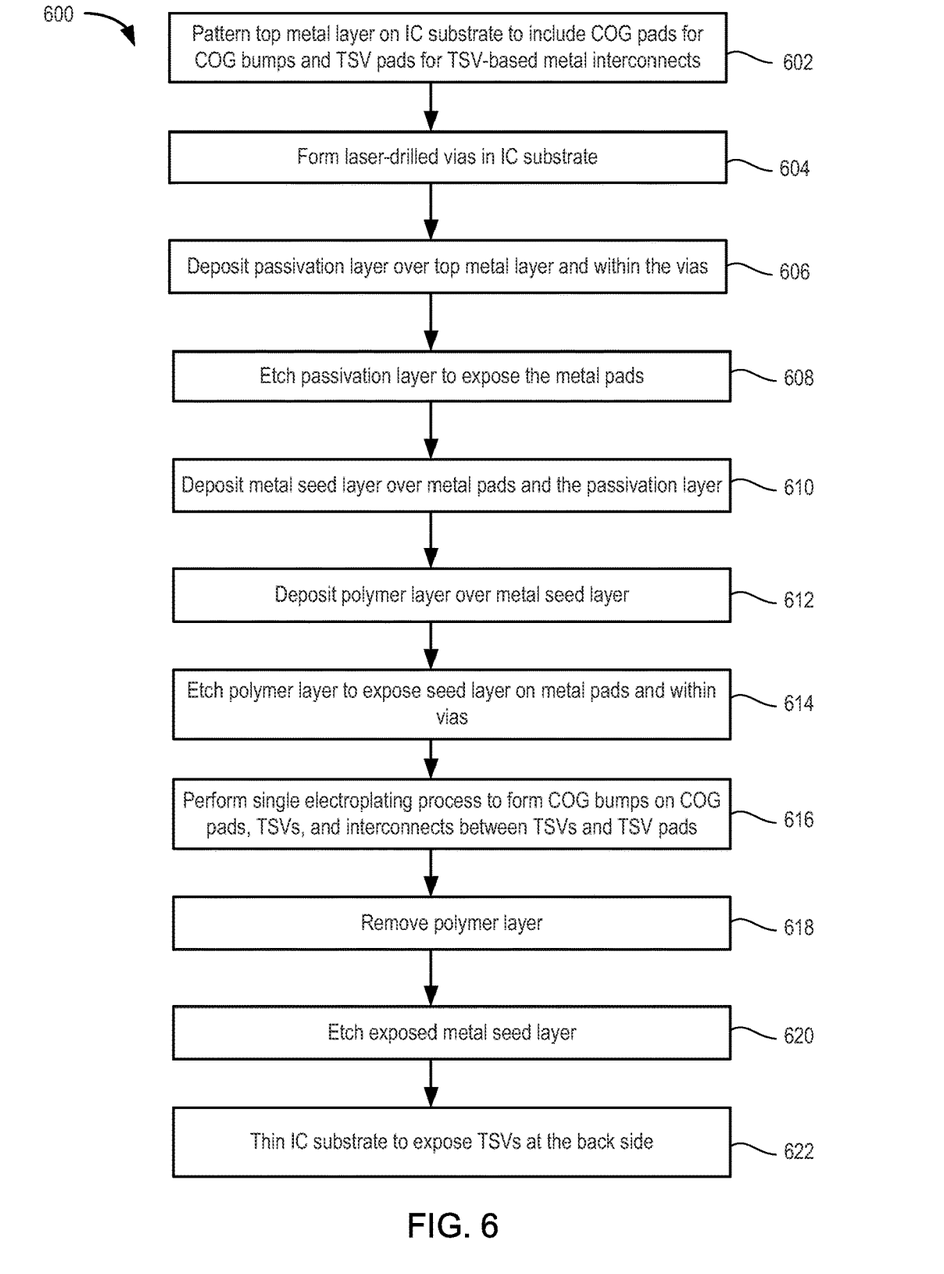
FIG. 6 is a flow diagram depicting a method of fabricating the IC according to an embodiment.

FIGS. 5A-5F depict cross-sections of the IC 306 after different stages of manufacture. FIG. 6 is a flow diagram depicting a method 600 of fabricating the IC 306 according to an embodiment. The method 600 begins at step 602, where a top metal layer on an IC substrate is patterned to include COG pads for COG bumps and TSV pads for TSV-based metal interconnects. Referring to FIG. 5A, a semiconductor substrate 502 includes active circuitry 504 and metal interconnect 506 formed thereon. The metal interconnect 506 includes a plurality of metal layers and dielectric layers separating the metal layers. The metal interconnect 506 is electrically coupled to the active circuitry 504. Metal pads 510 are patterned for COG bumps, and metal pads 508 are patterned for TSV-based metal interconnects. The active circuitry 504 includes a keep-out region 505 where vias will be formed in the substrate 502.

At step 604, laser-drilled vias are formed in the IC substrate from the front side of the IC. As shown in FIG. 5B, a laser-drilled via 512 is formed in the substrate 502. The laser-drilled via 512 can be formed using a laser configured to drill through the metal interconnect 506 and the substrate 502 to a determined depth.

At step 606, a passivation layer is deposited over the top metal layer and within the vias. At step 608, the passivation layer is etched to expose the metal pads of the top metal layer. The passivation layer can comprise any type of dielectric material suitable for such purpose. As shown in FIG. 5C, a passivation layer 514 is deposited and etched to expose the metal pads 508 and 510. The passivation layer 514 is deposited over the metal interconnect 506 and within the via 512.

At step 610, a metal seed layer is deposited over the metal pads and the passivation layer. The metal seed layer can comprise any type of metal suitable for use in an electroplating process, as described below. At step 612, a polymer is deposited over the metal seed layer. The polymer can comprise, for example, polyimide or the like. At step 614, the polymer layer is etched to expose the metal seed layer on the metal pads and within the vias. As shown in FIG. 5D, a metal seed layer 516 is deposited over the metal pads 508 and 510 and on the passivation layer 514. A polymer layer 518 is deposited over the metal seed layer 516 and etched to expose the metal pads 508 and 510, as well as the via 512.

At step 616, a single electroplating process is performed to form COG bumps on COG pads, and TSV-based metal interconnects coupled to TSV pads. As shown in FIG. 5E, the COG bumps 320 and the metal interconnect 314 is formed using a single electroplating process. The COG bumps 320 are formed in electrical contact with the metal pads 510, and the metal interconnects 314 are formed in electrical contact with the metal pads 508. The metal interconnects 314 each comprise a metal segment 314B formed on the front side of the substrate 502 and a TSV 314A. The metal interconnects 314 at least partially fill the vias 512. The COG bumps 320 and the metal interconnects 314 can comprise, for example, copper or gold.

At step 618, the polymer layer is removed. At step 620, the exposed metal seed layer is etched (removed). At step 622, the IC substrate is thinned to expose TSVs at the back side. For example, a back side grinding process can be used to thin the IC substrate. As shown in FIG. 5F, the polymer layer 518 and metal seed layer 516 are removed. The back side of the substrate 502 is thinned to expose the TSVs 314A of the metal interconnects 314. The exposed portion of the TSVs 314A can form the back side contacts 312.

Figure 7:
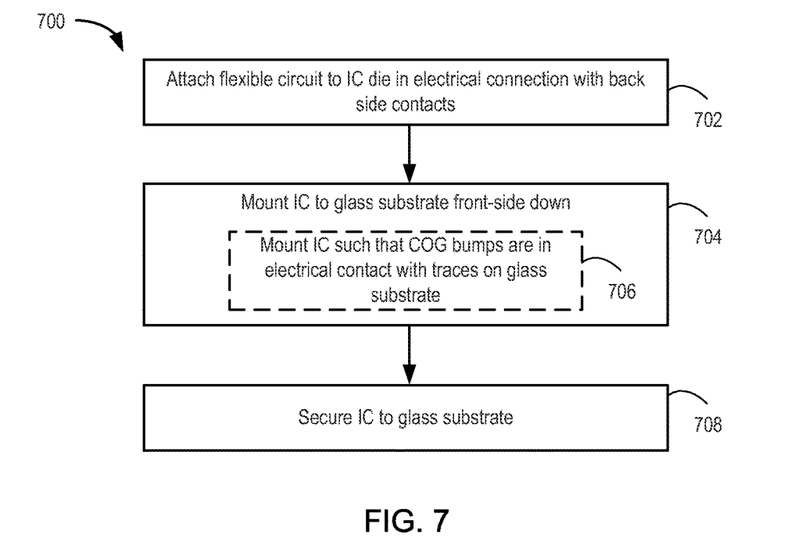
FIG. 7 is a flow diagram depicting a method of attaching an IC in a device according to embodiments.

FIG. 7 is a flow diagram depicting a method 700 of attaching the IC 306 in a device according to embodiments.

The method 700 begins at step 702, where the flexible circuit 308 is attached to the IC 306 in electrical connection with the back side contacts 312. For example, the flexible circuit 308 can be soldered so that the contacts 310 of the flexible circuit 308 are in electrical contact with the back side contacts 312. At step 704, the IC 306 is mounted front-side down on a glass substrate. For example, the IC 306 can be mounted to the TFT glass 302, as shown in FIG. 3. In such case, the step 704 includes a step 706, where the IC 306 is mounted such that the COG bumps 320 are in electrical contact with traces 316 on the TFT glass 302. In another example, the IC 306 is attached to the fingerprint sensor glass 350, as shown in FIG. 4. At step 708, the IC 306 is secured to the glass substrate. For example, the IC 306 can be secured using epoxy or the like. In another embodiment, step 702 can be performed after step 706. That is, the flexible circuit 308 can be attached to the IC 306 after the IC is mounted to the glass substrate.

The embodiments and examples set forth herein were presented in order to best explain the embodiments in accordance with the present technology and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

In view of the foregoing, the scope of the present disclosure is determined by the claims that follow.

We claim:

1. An integrated circuit (IC) die configured to be disposed on a first substrate, comprising:
   a semiconductor substrate having a plurality of metal layers formed over a first side of the semiconductor substrate;
   active circuitry disposed between the semiconductor substrate and the plurality of metal layers, wherein the active circuitry is coupled to the plurality of metal layers and comprises:
      at least one keep out region;
      a capacitive sensing device; and
      a display driver device, wherein the capacitive sensing device and the display driver device are configured to operate electrodes disposed on the first substrate;
   laser-drilled vias disposed through the semiconductor substrate, wherein a first one of the laser-drilled vias is disposed within the at least one keep-out region of the active circuitry;
   metal contacts disposed on first metal pads disposed along at least a front side of the IC die, wherein the first metal pads comprise first exposed parts of a top layer of the plurality of metal layers, and communicatively couple the active circuitry with the metal contacts;
   metal interconnects disposed between second metal pads and the laser-drilled vias within a perimeter of the IC die, the second metal pads comprising second exposed parts of the top layer of the plurality of metal layers, wherein the metal interconnects at least partially fill the laser-drilled vias, are in contact with and electrically connected to the second metal pads, and are ohmically isolated from the first metal pads;
   back side contacts disposed on a back side of the IC die and within the perimeter of the IC die, the back side contacts comprising exposed portions of the metal interconnects in the laser-drilled vias, wherein the metal interconnects electrically couple the back side contacts with the active circuitry; and
   a flexible circuit soldered to the back side contacts, the flexible circuit communicatively coupled to the active circuitry via the back side contacts and the second metal pads.

2. The IC die of claim 1, wherein the metal contacts and the metal interconnects comprise gold or copper.

3. The IC die of claim 2, wherein the metal contacts are configured for electrical connection to traces formed on the first substrate.

4. The IC die of claim 1, wherein operating the electrodes comprises providing sensor signals from the capacitive sensing device via the metal contacts to at least a portion of the electrodes.

5. The IC die of claim 1, wherein operating the electrodes comprises providing display signals from the display driver device via the metal contacts to at least a portion of the electrodes.

6. The IC die of claim 1, wherein the active circuitry is further coupled to the back side contacts through the metal interconnects.

7. A display device, comprising:
   a glass substrate;
   display electrodes;
   capacitive sensor electrodes;
   traces disposed on the glass substrate coupled to the display electrodes and the capacitive sensor electrodes;
   an integrated circuit (IC) die mounted to the glass substrate, the IC die including:
      a semiconductor substrate;
      active circuitry disposed between the semiconductor substrate and a plurality of metal layers, wherein the active circuitry is coupled to the plurality of metal layers and comprises:
         at least one keep out region;
         a capacitive sensing device configured to operate the capacitive sensor electrodes via the traces disposed on the glass substrate; and
         a display driver device configured to operate the display electrodes via the traces disposed on the glass substrate;
      laser-drilled vias disposed through the semiconductor substrate of the IC die, wherein a first one of the laser-drilled vias is disposed within the at least one keep-out region of the active circuitry;
      metal contacts on a front side of the IC die facing the glass substrate, and disposed on first metal pads, wherein the first metal pads comprise first exposed parts of a top layer of the plurality of metal layers, and communicatively couple the active circuitry with the metal contacts;
      metal interconnects disposed between second metal pads and the laser-drilled vias within a perimeter of the IC die, the second metal pads comprising second exposed parts of the top layer of the plurality of metal layers, wherein the metal interconnects at least partially fill the laser-drilled vias, are in contact with and electrically connected to the second metal pads, and are ohmically isolated from the first metal pads; and
      back side contacts disposed on a back side of the IC die and within the perimeter of the IC die, the back side contacts comprising exposed portions of the metal interconnects in the laser-drilled vias, wherein the metal interconnects electrically couple the back side contacts with the active circuitry; and a flexible circuit soldered to the back side contacts, the flexible circuit is communicatively coupled to the active circuitry via the back side contacts and the second metal pads.

8. The display device of claim 7, wherein operating the capacitive sensor electrodes comprises providing sensor signals from the capacitive sensing device to the capacitive sensor electrodes.

9. The display device of claim 7, wherein operating the display electrodes comprises providing display signals from the display driver device to the display electrodes.

10. The display device of claim 7, wherein the metal contacts are coupled to the traces.

* * * * *